(12) United States Patent
Jandzinski et al.

(10) Patent No.: US 10,888,040 B2
(45) Date of Patent: Jan. 5, 2021

(54) DOUBLE-SIDED MODULE WITH ELECTROMAGNETIC SHIELDING

(71) Applicant: Qorvo US, Inc., Greensboro, NC (US)

(72) Inventors: David Jandzinski, Summerfield, NC (US); Thomas Scott Morris, Lewisville, NC (US); Brian Howard Calhoun, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 235 days.

(21) Appl. No.: 16/115,155

(22) Filed: Aug. 28, 2018

(65) Prior Publication Data

US 2019/0104653 A1  Apr. 4, 2019

Related U.S. Application Data

(62) Division of application No. 15/720,686, filed on Sep. 29, 2017, now abandoned.

(51) Int. Cl.
*H05K 9/00* (2006.01)
*H01L 23/552* (2006.01)
(Continued)

(52) U.S. Cl.
CPC ......... *H05K 9/0088* (2013.01); *H01L 21/561* (2013.01); *H01L 23/3121* (2013.01);
(Continued)

(58) Field of Classification Search
CPC ............. H05K 1/0216; H05K 1/02187; H05K 1/0219; H05K 1/185; H05K 3/0097; H05K 3/284; H05K 3/46; H05K 9/0022; H05K 9/0039; H05K 9/0045; H05K 9/0081; H05K 9/0084; H05K 9/0088; H05K 2201/0707; H05K 2201/0919; H05K 2203/1316;
(Continued)

(56) References Cited

U.S. PATENT DOCUMENTS 4,882,657 A  11/1989  Braun
5,191,404 A  3/1993  Wu et al.
(Continued)

OTHER PUBLICATIONS

Non-Final Office Action for U.S. Appl. No. 15/720,686, dated Jun. 14, 2018, 17 pages.
(Continued)

*Primary Examiner* — Peter Dungba Vo
*Assistant Examiner* — Joshua D Anderson
(74) *Attorney, Agent, or Firm* — Withrow & Terranova, P.L.L.C.

(57) ABSTRACT

The present disclosure relates to a shielded double-sided module, which includes a module substrate with a ground plane, at least one top electronic component attached to a top surface of the module substrate and encapsulated by a first mold compound, a number of first module contacts attached to a bottom surface of the module substrate, a second mold compound, and a shielding structure. The second mold compound resides over the bottom surface of the module substrate, and each first module contact is exposed through the second mold compound. The shielding structure completely covers a top surface and a side surface of the module, and is electrically coupled to the ground plane within the module substrate.

14 Claims, 5 Drawing Sheets

Figure 1:
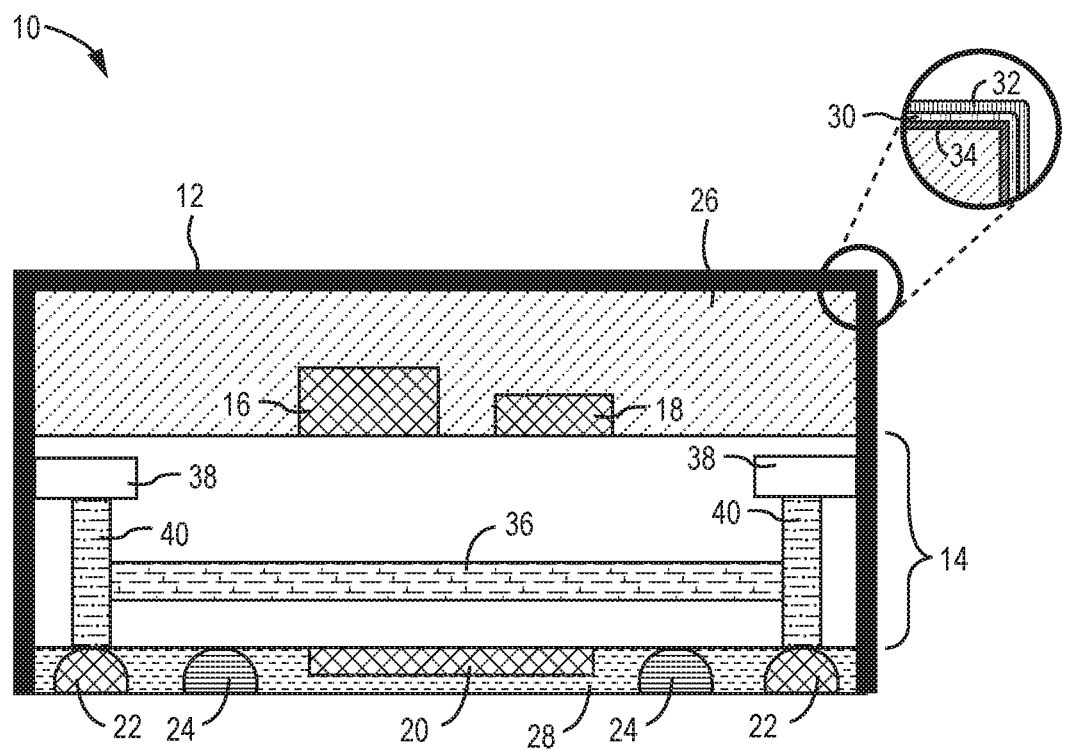

(51) Int. Cl.
  *H01L 23/31* (2006.01)
  *H01L 21/56* (2006.01)
  *H01L 23/00* (2006.01)
  *H01L 25/16* (2006.01)
  *H01L 25/065* (2006.01)
  *H01L 23/498* (2006.01)

(52) U.S. Cl.
  CPC ...... *H01L 23/3128* (2013.01); *H01L 23/3135* (2013.01); *H01L 23/552* (2013.01); *H01L 24/97* (2013.01); *H05K 9/0039* (2013.01); *H01L 23/49805* (2013.01); *H01L 23/49816* (2013.01); *H01L 24/16* (2013.01); *H01L 24/48* (2013.01); *H01L 25/0652* (2013.01); *H01L 25/0657* (2013.01); *H01L 25/16* (2013.01); *H01L 2224/16227* (2013.01); *H01L 2224/48227* (2013.01); *H01L 2224/97* (2013.01); *H01L 2225/0651* (2013.01); *H01L 2225/06517* (2013.01); *H01L 2225/06537* (2013.01); *H01L 2225/06548* (2013.01); *H01L 2225/06572* (2013.01); *H01L 2924/15311* (2013.01); *H01L 2924/19042* (2013.01); *H01L 2924/19105* (2013.01); *H01L 2924/19106* (2013.01); *H01L 2924/3025* (2013.01); *H05K 9/0022* (2013.01); *H05K 2201/0707* (2013.01); *Y10T 29/49789* (2015.01)

(58) Field of Classification Search
  CPC ...... H05K 2203/1327; Y10T 29/49789; Y10T 29/49792; H01L 21/561; H01L 23/3121; H01L 23/3128; H01L 23/3135; H01L 23/49805; H01L 23/49816; H01L 23/552; H01L 24/16; H01L 24/97; H01L 25/0652; H01L 25/0657; H01L 25/16; H01L 2224/16227; H01L 2224/48227; H01L 2224/81; H01L 2224/97; H01L 2225/06517; H01L 2225/06537; H01L 2225/06572; H01L 2225/06548; H01L 2924/15311; H01L 2924/19105; H01L 2924/19106; H01L 2924/3025
  See application file for complete search history.

(56) References Cited

U.S. PATENT DOCUMENTS

| | | | |
|---|---|---|---|
| 7,906,371 B2* | 3/2011 | Kim | H01L 24/97 438/113 |
| 8,910,023 B2 | 12/2014 | Yang | |
| 8,970,023 B2 | 3/2015 | Chou et al. | |
| 2002/0079568 A1 | 6/2002 | Degani et al. | |
| 2004/0056344 A1 | 3/2004 | Ogawa et al. | |
| 2004/0104469 A1 | 6/2004 | Yagi et al. | |
| 2004/0164425 A1 | 8/2004 | Urakawa | |
| 2009/0256244 A1 | 10/2009 | Liao et al. | |
| 2012/0228749 A1 | 9/2012 | Pagoda | |
| 2013/0155639 A1 | 6/2013 | Ogawa et al. | |
| 2015/0131231 A1 | 5/2015 | Yo0 et al. | |
| 2015/0282395 A1 | 10/2015 | Raorane et al. | |
| 2016/0035678 A1 | 2/2016 | Yoo et al. | |
| 2016/0190107 A1 | 6/2016 | Meyer et al. | |
| 2016/0276288 A1 | 9/2016 | Lee et al. | |
| 2016/0351509 A1* | 12/2016 | Dang | H01L 25/0655 |
| 2017/0141081 A1 | 5/2017 | Lee et al. | |
| 2017/0221835 A1 | 8/2017 | Yoo et al. | |
| 2017/0263565 A1* | 9/2017 | Renard | H01L 21/78 |
| 2017/0290207 A1 | 10/2017 | Smith et al. | |
| 2017/0309575 A1* | 10/2017 | Lee | H01L 23/552 |
| 2017/0347462 A1 | 11/2017 | Miwa | |
| 2017/0358540 A1 | 12/2017 | Min et al. | |
| 2018/0138130 A1* | 5/2018 | Lin | H01L 24/16 |
| 2018/0323128 A1* | 11/2018 | Dias | H01L 25/0657 |
| 2019/0140353 A1 | 5/2019 | Tombak et al. | |
| 2020/0075547 A1 | 3/2020 | Siomkos et al. | |

OTHER PUBLICATIONS

Extended European Search Report for European Patent Application No. 18190696.7, dated Dec. 19, 2018, 17 pages.
Non-Final Office Action for U.S. Appl. No. 16/119,554, dated Feb. 4, 2020, 9 pages.
Final Office Action for U.S. Appl. No. 16/119,554, dated Aug. 5, 2020, 10 pages.
Examination Report for European Patent Application No. 18190696.7, dated May 13, 2020, 5 pages.
Examination Report for European Patent Application No. 18190696.7, dated Jul. 27, 2020, 5 pages.
Advisory Action for U.S. Appl. No. 16/119,554, dated Oct. 16, 2020, 3 pages.
Non-Final Office Action for U.S. Appl. No. 16/119,554, dated Nov. 27, 2020, 10 pages.
Intention to Grant for European Patent Application No. 18190696.7, dated Nov. 3, 2020, 29 pages.

* cited by examiner

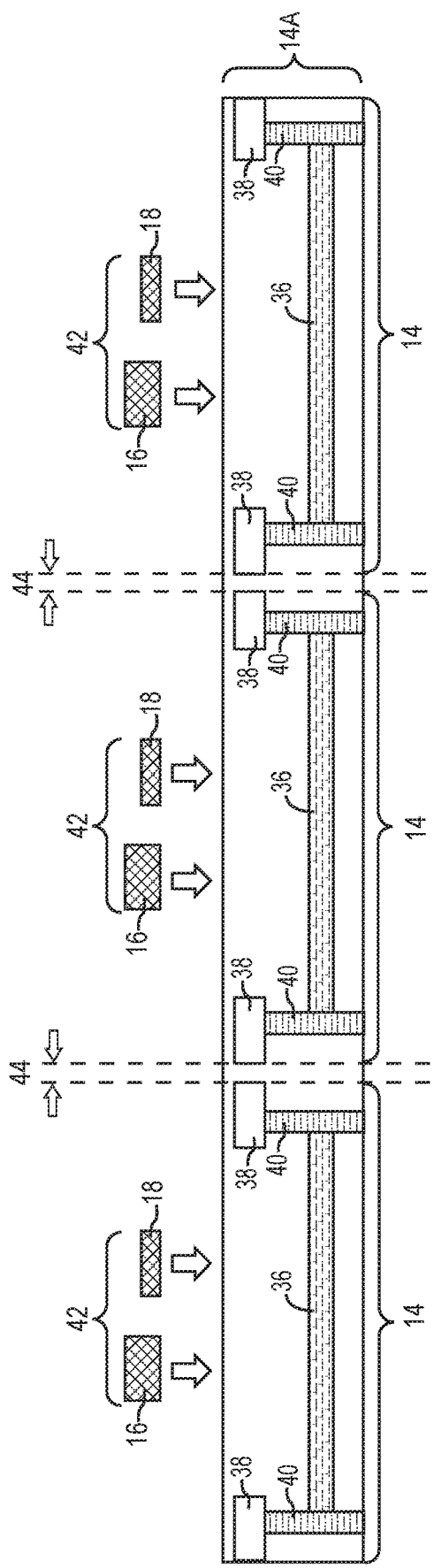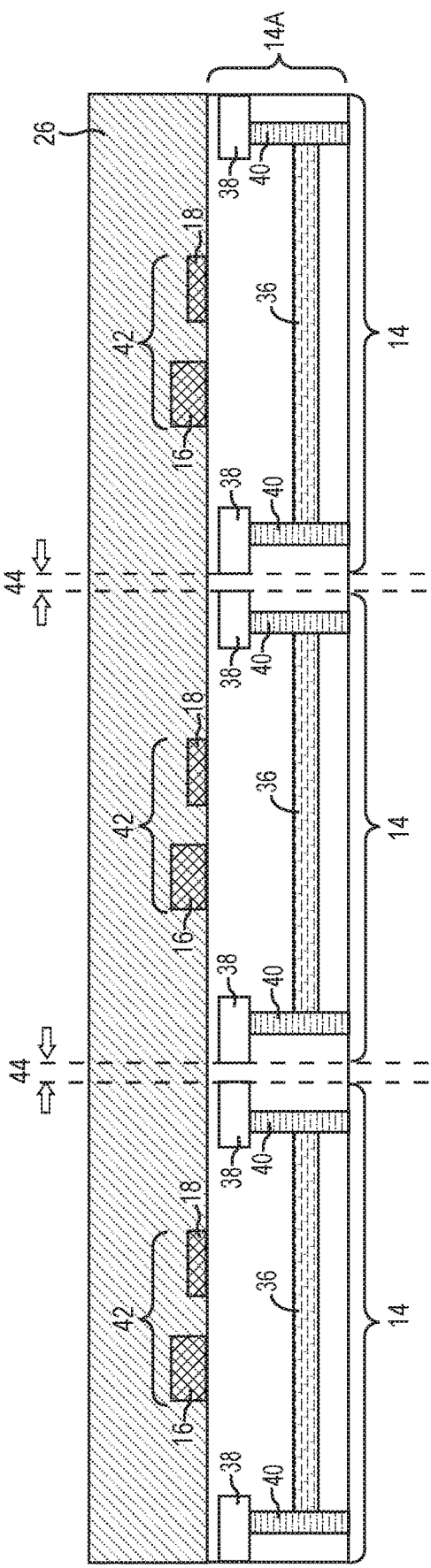

DOUBLE-SIDED MODULE WITH ELECTROMAGNETIC SHIELDING

RELATED APPLICATIONS

This application is a divisional of U.S. patent application Ser. No. 15/720,686, filed Sep. 29, 2017, the disclosure of which is hereby incorporated herein by reference in its entirety.

FIELD OF THE DISCLOSURE

The present disclosure relates to a double-sided module and a process for making the same, and more particularly to a double-sided module with electromagnetic shielding, and a process to provide the electromagnetic shielding for the double-sided module.

BACKGROUND

Electronic components have become ubiquitous in modern society. The electronics industry proudly, but routinely, announces accelerated clocking speeds and smaller integrated circuit modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed inherently means higher frequencies. Higher frequencies mean shorter wavelengths. Shorter wavelengths mean shorter conductive elements act as antennas to broadcast these electromagnetic emissions. These electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have lots of radiating elements that raise EMI concerns. Thus, even electronic modules that do not have high clock speeds may need to address EMI issues.

One way to reduce EMI is to shield the integrated circuit modules that cause EMI or that are sensitive to EMI. Typically the shield is formed from a grounded conductive material that covers a portion of one circuit module. When electromagnetic emissions from the circuit module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the module does not suffer EMI from other modules.

However, as the integrated circuit modules continue to become smaller from miniaturization, creating effective shields that do not materially add to the size of the module becomes more difficult. Thus, there is a need for an electromagnetic shield that is inexpensive to manufacture on a large scale, does not substantially change the size of the integrated circuit module, and effectively deals with EMI concerns.

SUMMARY

The present disclosure relates to a double-sided module with electromagnetic shielding, and a process for making the same. The disclosed shielded double-sided module is formed from a non-shielded module and a shielding structure. The non-shielded module includes a module substrate with a ground plane, at least one top electronic component, a first mold compound, a number of first module contacts, and a second mold compound. The at least one top electronic component is attached to a top surface of the module substrate, and each first module contact is formed at a bottom surface of the module substrate. The first mold compound resides over the top surface of the module substrate and encapsulates the at least one top electronic component, and the second mold compound resides over the bottom surface of the module substrate. Each first module contact is exposed through the second mold compound. Herein, a top surface of the non-shielded module is a top surface of the first mold compound, a bottom surface of the non-shielded module is a bottom surface of the second mold compound, and a side surface of the non-shielded module is a combination of a side surface of the first mold compound, a side surface of the module substrate, and a side surface of the second mold compound. The shielding structure completely covers the top surface and the side surface of the non-shielded module, and the shielding structure is electrically coupled to the ground plane within the module substrate.

In one embodiment of the shielded double-sided module, the non-shielded module further includes at least one bottom electronic component attached to the bottom surface of the module substrate. Herein, each first module contact is taller than the at least one bottom electronic component, and the second mold compound encapsulates the at least one bottom electronic component.

In one embodiment of the shielded double-sided module, the non-shielded module further includes a number of second module contacts formed at the bottom surface of the module substrate. Herein, each second module contact is taller than the at least one bottom electronic component. Each second module contact is exposed through the second mold compound. Each first module contact is electrically coupled to the ground plane and electrically isolated from the second module contacts.

In one embodiment of the shielded double-sided module, the bottom surface of the non-shielded module is not covered by the shielding structure.

In one embodiment of the shielded double-sided module, the shielding structure includes a first layer completely covering the top surface of the non-shielded module and the side surface of the non-shielded module, and a second layer over the first layer. Herein, the first layer is formed of copper, aluminum, silver, or gold, and the second layer is formed of nickel.

In one embodiment of the shielded double-sided module, a thickness of the first layer is between 3 μm and 16 μm, and a thickness of the second layer is between 1 μm and 3 μm.

In one embodiment of the shielded double-sided module, the module substrate further includes at least one conductive element electrically coupled to the ground plane by via structures. Herein, the at least one conductive element is positioned at a periphery of the module substrate and exposed through the side surface of the module substrate, such that the shielding structure is in contact with at least one conductive element.

In one embodiment of the shielded double-sided module, the first module contacts are electrically coupled to the ground plane by the via structures.

According to an exemplary process, a precursor package having a number of modules is provided first. Herein, an inter-module area is in between two adjacent modules. Each module includes a module substrate with a ground plane, at least one top electronic component attached to a top surface of the module substrate and encapsulated by a first mold compound, and a number of first module contacts formed at a bottom surface of the module substrate and encapsulated by a second mold compound. The module substrate includes at least one conductive element electrically coupled to the ground plane. The at least one conductive element is positioned at a periphery of the module substrate, such that at least one conductive element is adjacent to an edge of one inter-module area. Next, the precursor package is sub-diced at each inter-module area to create an elongated cavity and expose the at least one conductive element associated with each module to the elongated cavity. The elongated cavity extends vertically from a top surface of the precursor package toward a bottom surface of the precursor package without extending completely through the second mold compound. A shielding structure is then applied completely over the top surface of the precursor package, the side surface of the precursor package, and exposed faces of each elongated cavity to form a shielded package. The shielding structure is in contact with the at least one conductive element associated with each module and electrically coupled to the ground plane. Finally, the shielded package is singulated into a number of shield modules. A top surface and a side surface of each shield module are completely covered by the shielding structure, and the shielding structure for each shielded module remains electrically coupled to the ground plane.

In one embodiment of the exemplary process, the elongated cavity formed in the sub-dicing procedure extends vertically beyond each first module contact and has a width that is wider than or equal to a width of the inter-module area, such that the at least one conductive element is exposed to the elongated cavity and in contact with the shielding structure.

In one embodiment of the exemplary process, the singulating procedure is provided by thinning the second mold compound until exposing each first module contact.

In one embodiment of the exemplary process, thinning the second mold compound is provided by a mechanical grinding procedure.

In one embodiment of the exemplary process, each module further includes at least one bottom electronic component attached to the bottom surface of the module substrate. Herein, each first module contact is taller than the at least one bottom electronic component and the second mold compound encapsulates the at least one bottom electronic component.

In one embodiment of the exemplary process, the elongated cavity formed in the sub-dicing procedure extends vertically beyond the at least one bottom electronic component and has a width that is wider than or equal to a width of the inter-module area, such that the at least one conductive element is exposed to the elongated cavity and in contact with the shielding structure.

In one embodiment of the exemplary process, the singulating procedure is provided by thinning the second mold compound until reaching the bottom of each elongated cavity to separate the shielded modules.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides an exemplary double-sided module with electromagnetic shielding according to one embodiment of the present disclosure.

FIGS. 2A-2G provide exemplary steps that illustrate a process to package the exemplary double-sided module shown in FIG. 1.

Figure 2C:
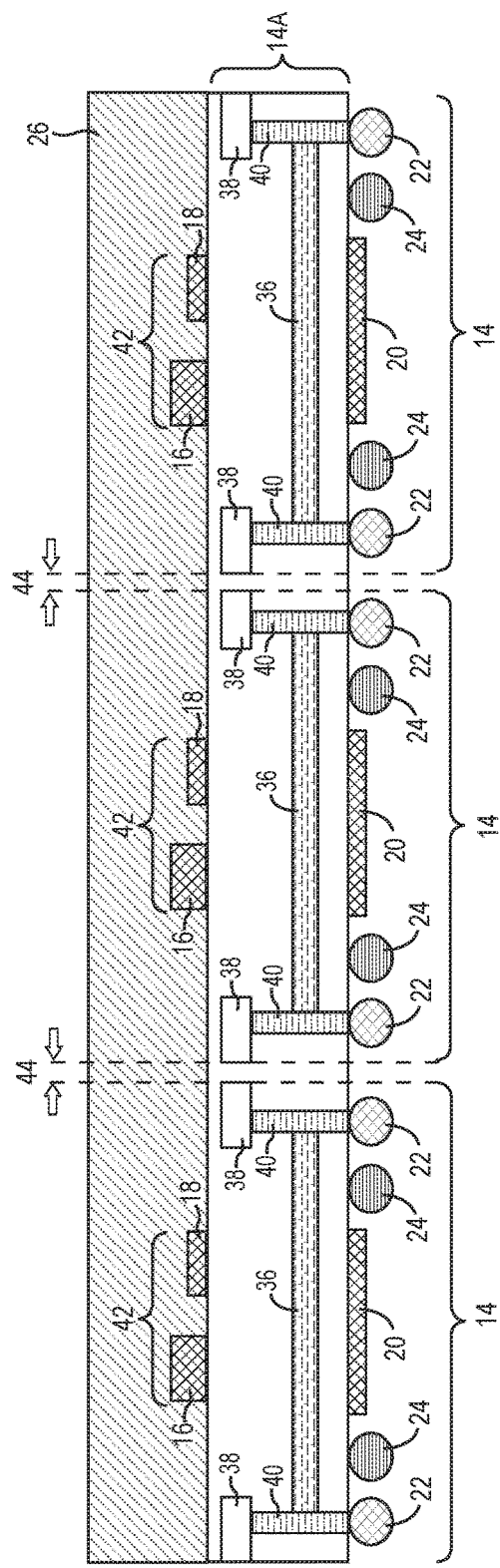
Figure 2D:
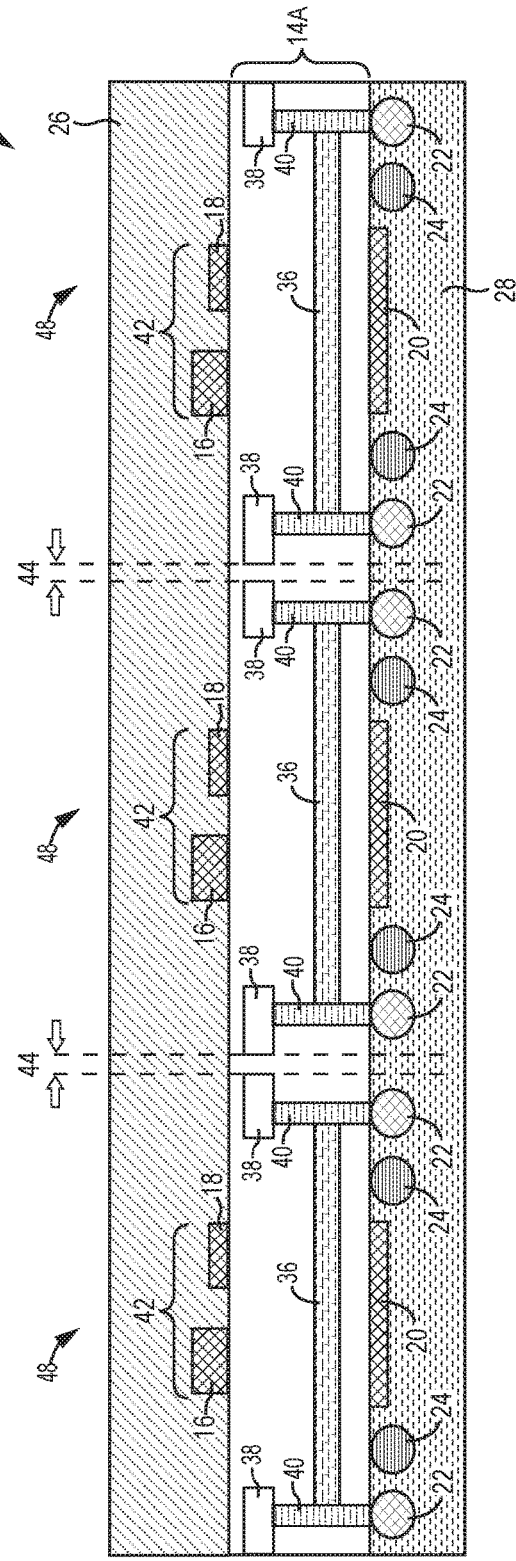
Figure 2E:
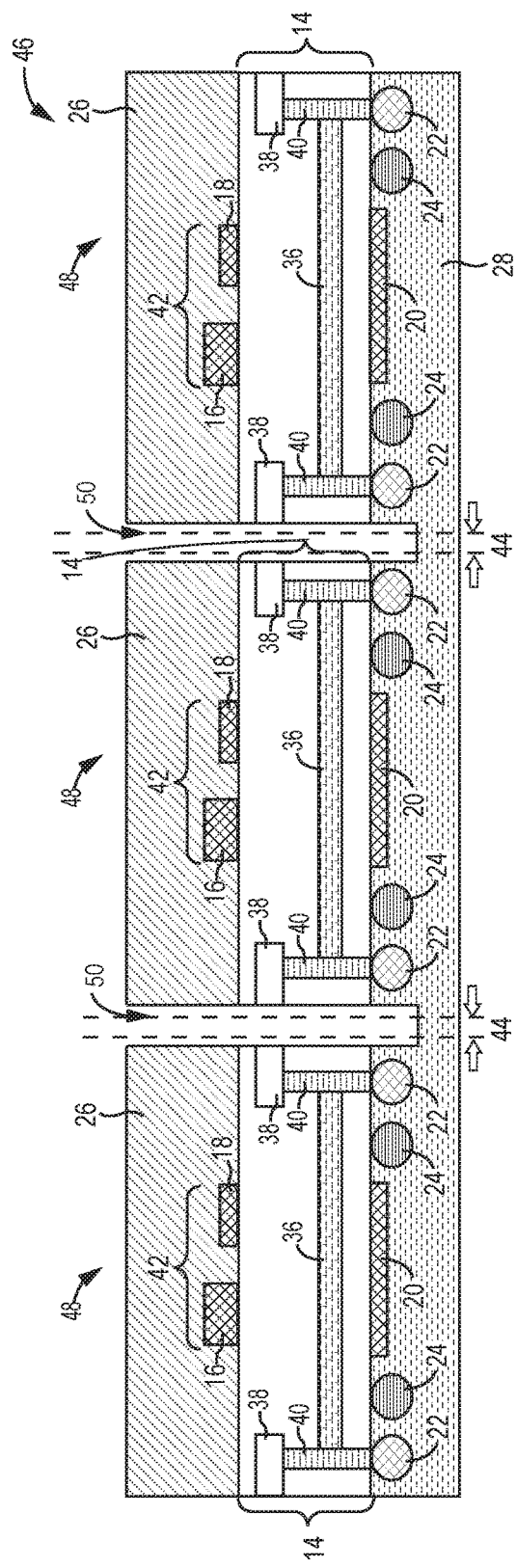
Figure 2F:
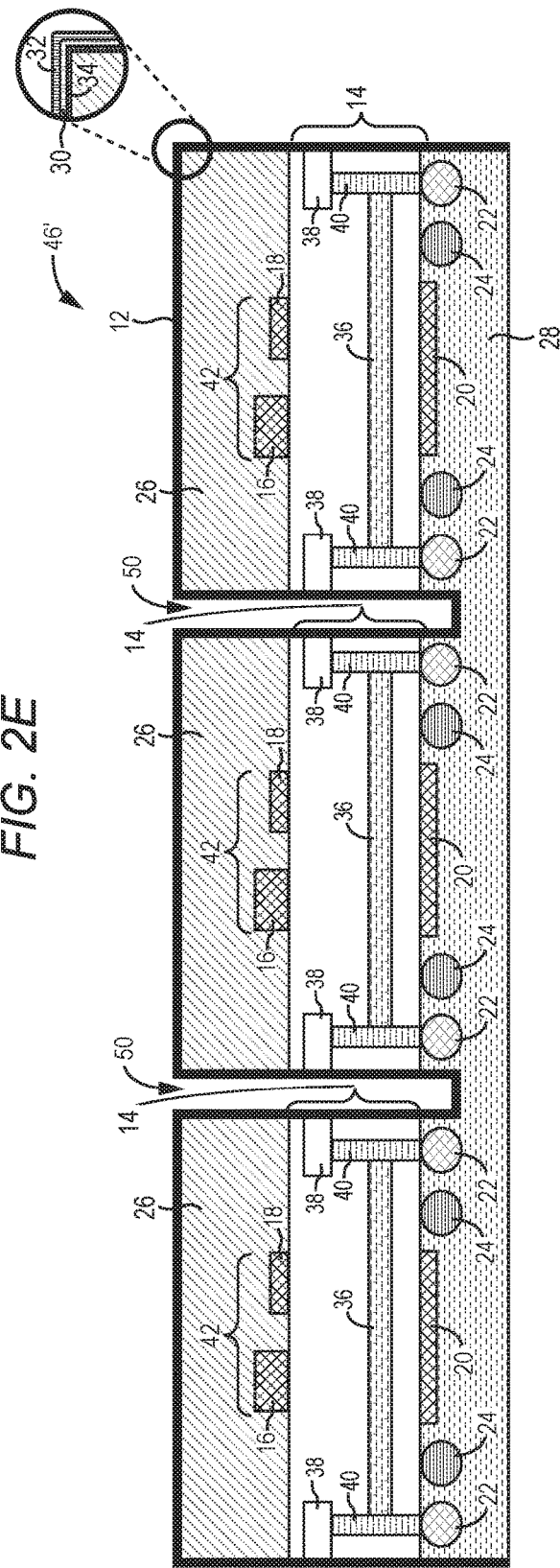
Figure 2G:
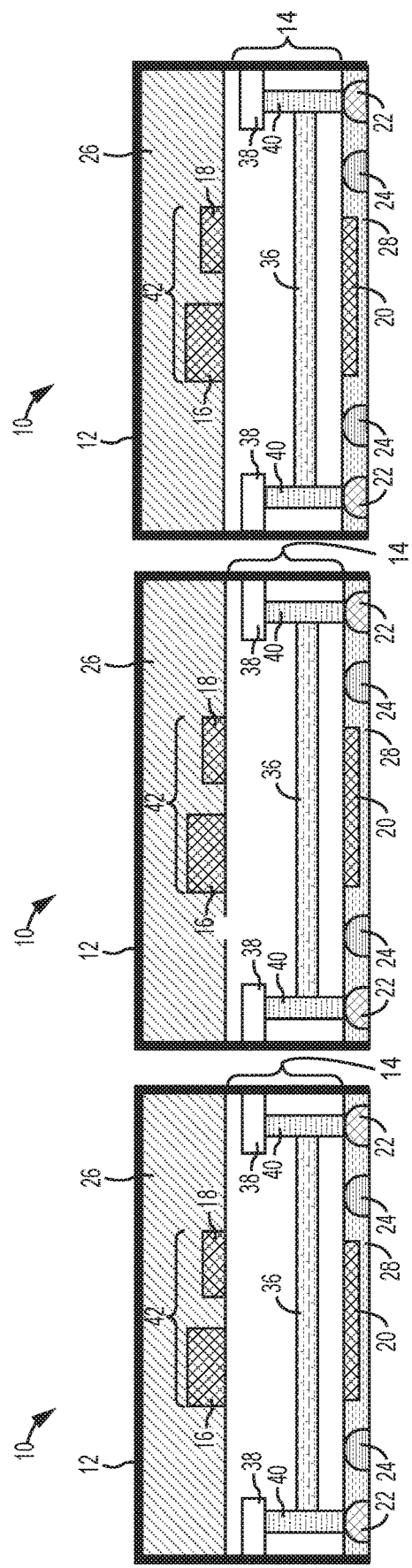

It will be understood that for clear illustrations, FIGS. 1-2G may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a double-sided module with electromagnetic shielding, and a process to provide the electromagnetic shielding for a double-sided module. FIG. 1 provides an exemplary shielded double-sided module 10 according to one embodiment of the present disclosure. For the purpose of this illustration, the exemplary shielded double-sided module 10 includes a shielding structure 12, a module substrate 14, a first top electronic component 16, a second top electronic component 18, a bottom electronic component 20, first module contacts 22, second module contacts 24, a first mold compound 26, and a second mold compound 28.

In detail, the first top electronic component 16 and the second top electronic component 18 are attached to a top surface of the module substrate 14. In different applications, the shielded double-sided module 10 may include fewer or more top electronic components. The first top electronic component 16/the second top electronic component 18 may be a flip-chip die, a wire-bonding die, a surface mounted device (SMD), an inductor, or other active/passive component. The first mold compound 26 resides over the top surface of the module substrate 14 and encapsulates the first and second top electronic components 16 and 18. The first mold compound 26 may be an organic epoxy resin system.

The bottom electronic component 20, the first module contacts 22, and the second module contacts 24 are attached to a bottom surface of the module substrate 14. In different applications, the shielded double-sided module 10 may include multiple bottom electronic components or no bottom electronic component. The bottom electronic component 20 may be a flip-chip die, a wire-bonding die, a SMD, an inductor, or other active/passive component. The first module contacts 22 and the second module contacts 24 are conductive and may be solder balls or copper pillars. The first module contacts 22 are used for grounded signals, and the second module contacts 24 are used for non-grounded signals and electrically isolated from the first module contacts 22. The second mold compound 28 resides over the bottom surface of the module substrate 14 and encapsulates the bottom electronic component 20. Herein, each first module contact 22 and each second module contact 24 are taller than the bottom electronic component 20 and exposed through the second mold compound 28. The second mold compound 28 may be formed from a same or different material as the first mold compound 26.

In this embodiment, a top surface of the shielded double-sided module 10 is a top surface of the first mold compound 26, a bottom surface of the shielded double-sided module 10 is a bottom surface of the second mold compound 28, and a side surface of the shielded double-sided module 10 is a combination of a side surface of the first mold compound 26, a side surface of the module substrate 14, and a side surface of the second mold compound 28. The shielding structure 12 completely covers the top surface of the shielded double-sided module 10 and completely covers the side surface of the shielded double-sided module 10, while the bottom surface of the shielded double-sided module 10 is exposed. Herein and hereafter, completely covering a surface refers to covering at least 99% of the surface.

The shielding structure 12 includes at least a first layer 30 and a second layer 32. The first layer 30 completely covers the top surface and the side surface of the shielded double-sided module 10, and may be formed of copper, aluminum, silver, gold, or other conductive materials with a thickness between 3 μm and 16 μm. The second layer 32 resides over the first layer 30, and may be formed of nickel with a thickness between 1 μm and 3 μm. In order to achieve a superior adhesion, the shielding structure 12 may further include a seed layer 34 formed of copper, aluminum, silver, gold, or other conductive materials with a thickness between 0.5 μm and 1.5 μm. The seed layer 34 may directly and completely cover the top surface and the side surface of the shielded double-sided module 10, and the first layer 30 resides over the seed layer 34.

Further, the module substrate 14 may be a laminate having a number of layers (not shown for clarity). These laminate layers of the module substrate 14 may include prepreg material. The module substrate 14 also includes a ground plane 36 and conductive elements 38 electrically coupled to the ground plane 36 by via structures 40. The ground plane 36 is in the interior portion of the module substrate 14. Each conductive element 38 is positioned at a periphery of the module substrate 14 and exposed through the side surface of the module substrate 14, such that the shielding structure 12 is in contact with each conductive element 38 and therefore electrically coupled to the ground plane 36. As used herein, the term "periphery" is defined to be the outermost part or region within a precise boundary, in particular, the boundary formed by the side surface of the module substrate 14. In addition, each first module contact 22 may be in contact with a corresponding via structure 40 and electrically coupled to the ground plane 36.

FIGS. 2A-2G provide exemplary steps that illustrate a process to fabricate the exemplary shielded double-sided module 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2A-2G.

Initially, a number of electronic component groups 42 are attached to a top surface of a package substrate 14A as depicted in FIG. 2A. The electronic component groups 42 may be attached to the package substrate 14A via an adhesive material (not shown). The package substrate 14A includes a number of the module substrates 14, and a number of inter-module areas 44. Each inter-module area 44 is in between adjacent module substrates 14 and has a small width. Herein, each electronic component group 42 is attached to a corresponding module substrate 14, and does not reside on any inter-module area 44. As described above, each module substrate 14 includes the ground plane 36 and the conductive elements 38 electrically coupled to the ground plane 36 by the via structures 40. Herein, the ground plane 36 in each module substrate 14 may be formed from a common ground plane. Each conductive element 38 is positioned at the periphery of the module substrate 14, such that each conductive element 38 is adjacent to an edge of one inter-module area 44 or exposed through a side surface of the package substrate 14A. In this embodiment, each electronic component group 42 includes the first top electronic component 16 and the second top electronic component 18. In different applications, each electronic component group 42 may include fewer or more top electronic components.

Next, the first mold compound 26 is applied over the top surface of the package substrate 14A to encapsulate each electronic component group 42 as depicted in FIG. 2B. The first mold compound 26 may be applied by various procedures, such as sheet molding, overmolding, compression molding, transfer molding, dam fill encapsulation, or screen print encapsulation. A curing process (not shown) is followed to harden the first mold compound 26. The curing temperature is between 100° C. and 320° C. depending on which material is used as the first mold compound 26.

One bottom electronic component 20, the first module contacts 22, and the second module contacts 24 are then attached at the bottom surface of each module substrate 14 as depicted in FIG. 2C. In different applications, there may be multiple bottom electronic components or no bottom electronic component attached to one module substrate 14. Each first module contact 22 used for grounded signals may be in contact with a corresponding via structure 40 and electrically coupled to the ground plane 36. Each second module contact 24 used for non-grounded signals is electrically isolated from the first module contacts 22. Herein, the first module contacts 22 and the second module contacts 24 are taller than the bottom electronic component 20. None of the bottom electronic component 20, the first module contacts 22, and the second module contacts 24 resides underneath any inter-module area 44.

After the bottom electronic component 20, the first module contacts 22, and the second module contacts 24 are attached, the second mold compound 28 is applied to form a double-sided package 46 as depicted in FIG. 2D. The second mold compound 28 resides over the bottom surface of the package substrate 14A to encapsulate each bottom electronic component 20, each first module contact 22, and each second module contact 24. The second mold compound 28 may be formed from a same or different material as the first mold compound 26. The second mold compound 28 may be applied by various procedures, such as sheet molding, overmolding, compression molding, transfer molding, dam fill encapsulation, or screen print encapsulation. A curing process (not shown) is followed to harden the second mold compound 28. The curing temperature is between 100° C. and 320° C. depending on which material is used as the second mold compound 28.

Herein, the double-sided package 46 includes a number of double-sided modules 48, which share the package substrate 14A, the first mold compound 26, and the second mold compound 28. Each double-sided module 48 includes one module substrate 14, one electronic component group 42 attached to the top surface of the module substrate 14, one bottom electronic component 20 attached to the bottom surface of module substrate 14, the first module contacts 22 and the second module contacts 24 formed at the bottom surface of the module substrate 14. Further, a top surface of the double-sided package 46 is the top surface of the first mold compound 26, a bottom surface of the double-sided package 46 is the bottom surface of the second mold compound 28, and a side surface of the double-sided package 46 is a combination of the side surface of the first mold compound 26, the side surface of the package substrate 14A, and the side surface of the second mold compound 28.

Next, the double-sided package 46 is sub-diced at each inter-module area 44 to create an elongated cavity 50 and partially separate each double-sided module 48, as depicted in FIG. 2E. The elongated cavity 50 extends vertically from the top surface of the first mold compound 26, through the package substrate 14A, and into the second mold compound 28 without extending completely through the second mold compound 28. The elongated cavity 50 extends vertically beyond the bottom electronic component 20. In one embodiment, the elongated cavity 50 may further extend beyond each first module contact 22 and each second module contact 24. As such, a portion of the second mold compound 28 underneath the elongated cavity 50 is thinner than a portion of the second mold compound 28 underneath the first and second module contacts 22 and 24. In a lateral direction, the elongated cavity 50 has a width that is wider than or equal to the width of the inter-module area 44, such that the conductive elements 38 adjacent to the edge of any inter-module area 44 are exposed to the elongated cavity 50. In addition, the elongated cavity 50 is not too wide to expose the first and/or the second module contact 22 and/or 24 that is close to the inter-module area 44. Each first module contact 22 and each second module contact 24 are still encapsulated by the second mold compound 28.

After the sub-dicing procedure is completed, the shielding structure 12 is applied to form a shielded double-sided package 46' as depicted in FIG. 2F. The shielding structure 12 completely covers the top surface of the double-sided package 46, the side surface of the double-sided package 46, and any exposed faces of each elongated cavity 50 without covering the bottom surface of the double-sided package 46. Since each conductive element 38 is exposed to one elongated cavity 50 or exposed through the side surface of the package substrate 14A, the shielding structure 12 is in direct contact with each conductive element 38. As such, the shielding structure 12 is electrically coupled to the ground plane 36 through the conductive elements 38 and the via structures 40. The shielding structure 12 may include the seed layer 34, the first layer 30, and the second layer 32. In one embodiment, the seed layer 34 may be formed of copper, aluminum, silver, gold, or other conductive materials using a metal deposition, an electroless and/or electrolytic plating process; the first layer 30 may be formed of copper, aluminum, silver, gold, or other conductive materials using an electrolytic plating process; and the second layer 32 may be formed of nickel using an electroless and/or electrolytic plating process.

Finally, the shielded double-sided package 46' is singulated into a number of the shielded double-sided modules 10 as depicted in FIG. 2G. The singulation of the shielded double-sided package 46' is provided by thinning the second mold compound 28 until reaching the bottom of each elongated cavity 50 to fully separate the shielded double-sided modules 10. The thinning procedure may be done with a mechanical grinding process. In some applications, a portion of each first module contact 22 and a portion of each second module contact 24 may be ground. Since each elongated cavity 50 extends vertically beyond the bottom electronic component 20, the thinning procedure of the second mold compound 28 will stop before exposing the bottom electronic component 20, such that the bottom electronic component 20 is still encapsulated by the second mold compound 28.

In one embodiment, each elongated cavity 50 may extend vertically beyond each first module contact 22 and each second module contact 24, thus the portion of the second mold compound 28 underneath the elongated cavity 50 is thinner than the portion of the second mold compound 28 underneath the first and second module contacts 22 and 24. Consequently, once the second mold compound 28 is thinned to expose each first module contact 22 and each second module contact 24, the shielded double-sided package 46' is automatically singulated into shielded double-sided modules 10 at each elongated cavity 50. In addition, since the shielding structure 12 completely covers any exposed faces of each elongated cavity 50, the side surface of each shielded double-sided module 10, which is formed from inner faces of the elongated cavity 50, is still completely covered by the shielding structure 12. Further, each first module contact 22 and each second module contact 24 are taller than the bottom electronic component 20, and therefore the bottom electronic component 20 is not exposed and still encapsulated by the second mold compound 28.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
providing a precursor package having a plurality of modules, wherein:
inter-module areas are provided in between adjacent modules of the plurality of modules;
each of the plurality of modules comprises a module substrate with a ground plane within the module substrate, at least one top electronic component attached to a top surface of the module substrate and encapsulated by a first mold compound provided at the top surface of the module substrate, and a plurality of first module contacts formed at a bottom surface of the module substrate and encapsulated by a second mold compound provided at the bottom surface of the module substrate; and
the module substrate comprises at least one conductive element within the module substrate and electrically coupled to the ground plane and the first module contacts, wherein the at least one conductive element is positioned at a periphery of the module substrate, such that the at least one conductive element is adjacent to an edge of a corresponding inter-module area;
sub-dicing the precursor package at each inter-module area to create an elongated cavity, wherein:
the elongated cavity extends vertically from a top surface of the precursor package toward a bottom surface of the precursor package extending into the second mold compound without extending completely through the second mold compound; and
the at least one conductive element associated with each of the plurality of modules is exposed to a corresponding elongated cavity;
applying a shielding structure completely over the top surface of the precursor package, a side surface of the precursor package, and exposed faces of each elongated cavity to form a shielded package, wherein the shielding structure is in contact with the at least one conductive element associated with each of the plurality of modules to electrically couple the shielding structure to the ground plane; and
singulating the shielded package into a plurality of shield modules, wherein a top surface and a side surface of each of the plurality of shield modules are completely covered by the shielding structure, and the shielding structure for each of the plurality of shielded modules remains electrically coupled to the ground plane.

2. The method of claim 1 wherein the elongated cavity formed during the sub-dicing extends vertically beyond each of the plurality of first module contacts.

3. The method of claim 2 wherein singulating the shielded package into the plurality of shield modules is provided by thinning the second mold compound until each of the plurality of the first module contacts is exposed.

4. The method of claim 3 wherein thinning the second mold compound is provided by a mechanical grinding procedure.

5. The method of claim 1 wherein each of the plurality of modules further comprises at least one bottom electronic component attached to the bottom surface of the module substrate, wherein:
each of the plurality of first module contacts is taller than the at least one bottom electronic component; and
the second mold compound encapsulates the at least one bottom electronic component.

6. The method of claim 5 wherein the elongated cavity formed during the sub-dicing extends vertically beyond the at least one bottom electronic component.

7. The method of claim 6 wherein singulating the shielded package into the plurality of shield modules is provided by thinning the second mold compound until reaching the bottom of each elongated cavity to separate the plurality of shielded modules.

8. The method of claim 7 wherein thinning the second mold compound is provided by a mechanical grinding procedure.

9. The method of claim 5 wherein each of the plurality of modules further comprises a plurality of second module contacts formed at the bottom surface of the module substrate, wherein:
each of the plurality of second module contacts is taller than the at least one bottom electronic component;
each of the plurality of second module contacts is exposed through the second mold compound after singulating the shielded package; and
each of the plurality of first module contacts is electrically coupled to the ground plane and electrically isolated from the plurality of second module contacts.

10. The method of claim 1 wherein the shielding structure comprises:
a first layer completely covering the top surface of the precursor package, the side surface of the precursor package, and the exposed faces of each elongated cavity, wherein the first layer is formed of copper, aluminum, silver, or gold; and
a second layer over the first layer and formed of nickel.

11. The method of claim 10 wherein a thickness of the first layer is between 3 μm and 16 μm.

12. The method of claim 10 wherein a thickness of the second layer is between 1 μm and 3 μm.

13. The method of claim 1 wherein the shielding structure comprises:

a seed layer completely covering the top surface of the precursor package, the side surface of the precursor package, and the exposed faces of each elongated cavity, wherein the seed layer is formed of copper, aluminum, silver, or gold;

a first layer over the seed layer and formed of copper, aluminum, silver, or gold; and a second layer over the first layer and formed of nickel.

14. The method of claim 13 wherein the seed layer is formed by an electroless plating process, the first layer is formed by an electrolytic plating process, and the second layer is formed by at least one of an electroless plating process and an electrolytic plating process.

\* \* \* \* \*